United States Patent
Kamiichi et al.

(10) Patent No.: US 7,309,657 B2
(45) Date of Patent: Dec. 18, 2007

(54) CIRCUIT BOARD, LIQUID DISCHARGE APPARATUS, AND METHOD OF MANUFACTURING THE CIRCUIT BOARD

(75) Inventors: Masato Kamiichi, Kanagawa (JP); Keiichi Sasaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 219 days.

(21) Appl. No.: 10/929,492

(22) Filed: Aug. 31, 2004

(65) Prior Publication Data
US 2005/0053774 A1    Mar. 10, 2005

(30) Foreign Application Priority Data
Sep. 4, 2003   (JP)   ............... 2003-312634

(51) Int. Cl.
*H01L 21/302*   (2006.01)
(52) U.S. Cl. .............. 438/720; 439/706; 347/62; 216/16
(58) Field of Classification Search ............ 438/706, 438/714, 720; 347/59, 61, 62; 216/13, 16
See application file for complete search history.

(56) References Cited
U.S. PATENT DOCUMENTS

| | | | | |
|---|---|---|---|---|
| 5,870,121 A | * | 2/1999 | Chan .................. | 347/59 |
| 5,943,070 A | * | 8/1999 | Kamiyama et al. ........... | 347/19 |
| 6,774,397 B2 | * | 8/2004 | Arao et al. .................. | 257/59 |
| 7,053,538 B1 | * | 5/2006 | Ha et al. .................... | 313/309 |
| 2003/0234833 A1 | * | 12/2003 | Kim ............................ | 347/62 |

FOREIGN PATENT DOCUMENTS

JP   9-11468   1/1997

* cited by examiner

*Primary Examiner*—Lan Vinh
(74) *Attorney, Agent, or Firm*—Fitzpatrick, Cella, Harper & Scinto

(57) ABSTRACT

Provided is a method for manufacturing a circuit board including an electrode wiring formed above a surface portion of a substrate, and a plurality of electrothermal converting elements which have a heating resistor film for generating thermal energy formed above the electrode wiring. The method includes: forming an electrode wiring layer for forming the electrode wiring, forming the heating resistor film; and collectively etching the electrode wiring layer and the heating resistor film to thereby form the electrode wiring. With the method according to the present invention, the circuit board can be manufactured with a higher density, higher endurance, and lower power consumption recording head to provide high resolution images.

5 Claims, 11 Drawing Sheets

CIRCUIT BOARD, LIQUID DISCHARGE APPARATUS, AND METHOD OF MANUFACTURING THE CIRCUIT BOARD

BACKGROUND OF THE INVENTION

1. Field of the Invention

The present invention relates to a circuit board on which electrothermal converting elements having a heating resistor layer are formed, a liquid discharge head, and a method of manufacturing the circuit board. In particular, the present invention relates to a method of manufacturing a circuit board used for a liquid discharge head which converts electric energy to thermal energy and discharges a liquid by the thermal energy.

2. Related Background Art

An ink jet recording apparatus records a high definition image by discharging fine droplets of ink from discharge ports to a recording target member. At this time, the ink jet recording apparatus converts electric energy to thermal energy. The thermal energy generates air bubbles in the ink. The action forces of the air bubbles discharge liquid droplets from the discharge ports provided to a leading end portion of a liquid discharge head. The liquid droplets discharged from the discharge ports are attached onto the recording target member to record the image. In general, such a liquid discharge head has a circuit board on which plural electrothermal converting elements that convert electric energy to thermal energy are provided.

A heating resistor is a thermal converting member which converts electric energy to thermal energy.

FIG. 5 is a plan view showing electrothermal converting elements on a conventional circuit board used for a liquid discharge head. Referring to FIG. 5, plural electrothermal converting elements 20 are arranged on a substrate 11 on which a silicon oxide film has been formed as an insulating film.

In order to form each of the electrothermal converting elements 20, an electrode wiring 13 is formed and then a heating resistor film 14 is formed so as to cover the electrode wiring 13.

FIGS. 6A to 6E are sectional views taken along a line 6-6 of FIG. 5 for explaining a method of manufacturing the conventional circuit board used for the liquid discharge head. FIGS. 7A to 7E are plan views for explaining the method of manufacturing the conventional circuit board.

With reference to the drawings, the method of manufacturing the conventional circuit board will be described.

First, a silicon wafer is used as the substrate 11, and an oxide layer 12 is formed on the silicon wafer by thermal oxidation. Then, a conductive layer for forming the electrode wiring 13 is formed on the oxide layer 12 (see FIGS. 6A and 7A). Al, Al—Si, Al—Cu, Al—Si—Cu, or the like is used for the conductive layer.

Using a mask, a part which composes a heating portion 17 is formed by dry etching (see FIGS. 6B and 7B). Next, the heating resistor film 14 for forming the electrothermal converting element is formed by a sputtering method (see FIGS. 6C and 7C).

TaN, $HfB_2$, TaSiN, or the like is used for the heating resistor film 14.

Next, using a mask, while the heating portion 17 is being formed, the heating resistor film 14 is patterned by dry etching so as to cover the electrode wiring 13 (see FIGS. 6D and 7D).

Then, a protective film 15 made of P—SiN (SiN formed by a plasma chemical vapor deposition (CVD) method) is formed. After that, a cavitation resistance film 16 made of Ta is formed on the protective film 15 by a sputtering method (see FIGS. 6E and 7E).

The circuit board used for a liquid discharge head and having the structure described above is disclosed in JP 09-011468 A.

In recent ink jet recording apparatuses, it is necessary to further narrow a space between adjacent electrothermal converting elements to achieve a higher density arrangement, thus providing higher resolution images. It is also necessary to suppress power consumption by generating air bubbles with a small amount of applied energy.

However, when the conventional manufacturing method of the circuit board described above is used, as shown in FIG. 5, the heating resistor film 14 is formed so as to cover the electrode wiring 13. Thus, a heating resistor film space 18 is unnecessarily formed. The heating resistor film space 18 serves as an alignment margin. The alignment margin would not be required if there were no misalignment between the layers, but actual manufacturing processing involves a misalignment generated between the layers, thereby requiring the alignment margin.

The heating resistor film space 18 required due to the misalignment between the layers is a big problem under the circumstances in which the heating converting elements are arranged in higher density for providing the higher resolution images.

In addition, when there is a misalignment between the layers as shown in FIG. 8B, there is a difference in area of the effective electrothermal converting element, compared with an acceptable circuit board of FIG. 8A. This causes a problem in that a current concentration portion 21 is formed in a part of the electrothermal converting element to reduce the endurance of the electrothermal converting element.

Further, when the conventional manufacturing method of the circuit board described above is employed to form an electrothermal converting element according to another form as shown in FIG. 9, the heating resistor film space 18 makes a heating space 19 Larger. Thus, bubbling efficiency is reduced and applied energy is increased.

SUMMARY OF THE INVENTION

Therefore, it is an object of the present invention to modify a method of manufacturing a circuit board and to provide a circuit board which does not require a heating resistor film space 18, and a liquid discharge head using the circuit board.

In order to achieve the above object, according to the present invention, there is provided a circuit board including: an electrode wiring formed above a surface portion of a substrate; a plurality of electrothermal converting elements which have a heating resistor film for generating thermal energy formed above the electrode wiring; and a protective layer formed above the electrode wiring and the electrothermal converting elements, characterized in that at least one end face of the electrode wiring is directly covered with the protective layer.

Further, the circuit board including the electrode wiring formed above the surface portion of the substrate, and the electrothermal converting element which includes the heating resistor film for generating thermal energy formed above the surface portion of the substrate so as to electrically connect to the electrode wiring, is characterized in that an end part of the electrode wiring and an end part of the heating resistor film which composes a heating portion are formed in an identical line.

Furthermore, the circuit board including the electrode wiring formed above the surface portion of the substrate, and the electrothermal converting element for generating thermal energy formed above the surface portion of the substrate so as to electrically connect to the electrode wiring, is characterized in that the circuit board is formed by removing a part of a conductive layer which composes a heating portion by etching; forming the heating resistor film; and collectively etching a part of the conductive layer and a part of the heating resistor film which compose the electrode wiring portion.

The circuit board is characterized in that the part of the conductive layer which composes the heating portion is removed by dry etching or wet etching.

The circuit board is characterized in that etching for the parts which compose the electrode wiring is carried out by dry etching.

Therefore, a circuit board which does not require the heating resistor film space 18 and a liquid discharge head using the circuit board can be provided by the method according to the present invention.

According to the method of manufacturing the circuit board according to the present invention, it is possible to provide the circuit board which does not require the heating resistor film space 18, and the liquid discharge head using the circuit board. It is also possible to manufacture a higher density, higher endurance, and lower power consumption circuit board to provide higher resolution images.

DESCRIPTION OF THE PREFERRED EMBODIMENTS

Figure 2:
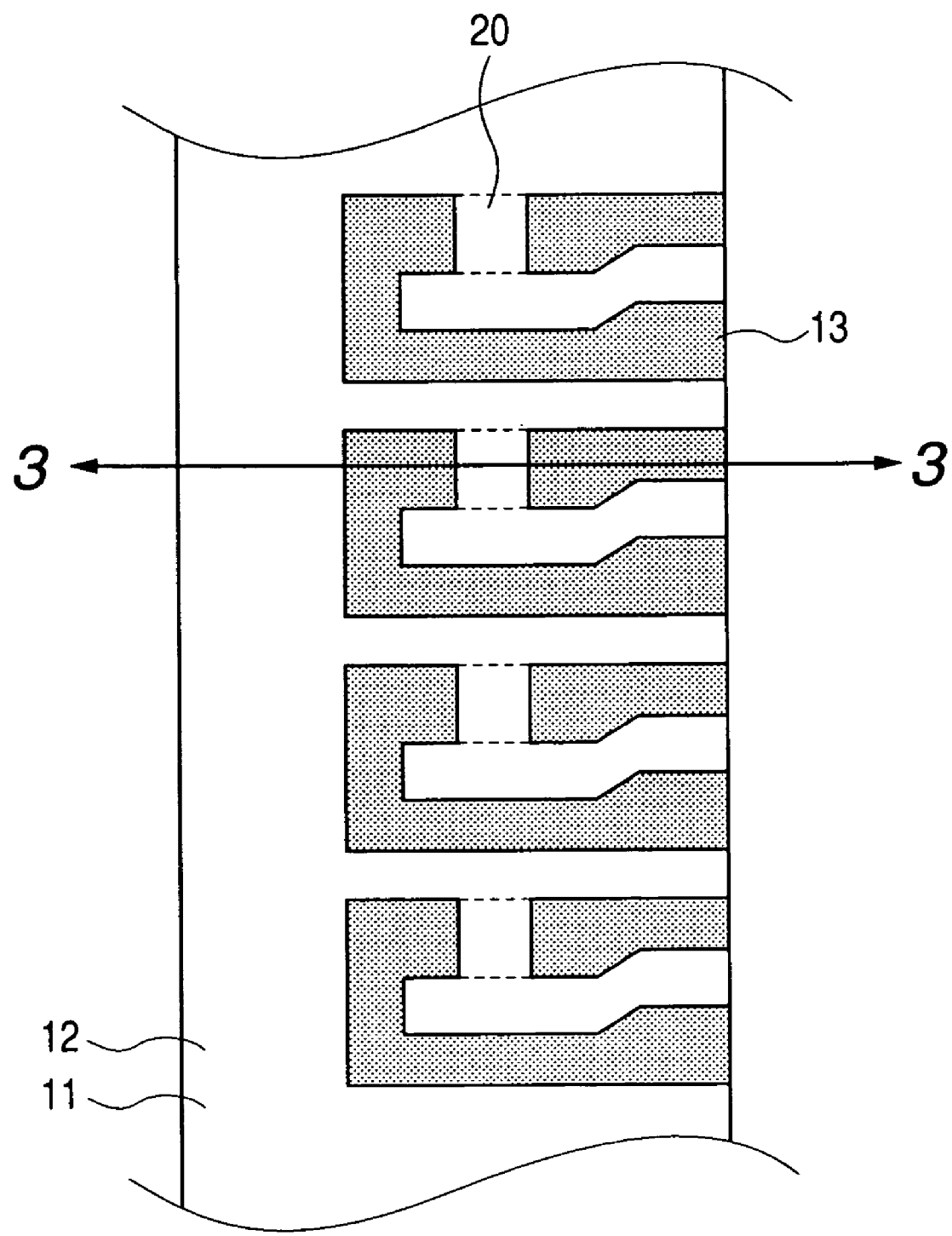
FIG. 2 is a plan view showing a state in which plural electrothermal converting elements are arranged on the circuit board used for the liquid discharge head according to the present invention.

FIG. 2 is a plan view showing electrothermal converting elements on a circuit board used for a liquid discharge head according to the present invention.

FIGS. 3A to 3E are sectional views taken along a line 3-3 of FIG. 2 for explaining a method of manufacturing the circuit board used for the liquid discharge head according to the present invention. FIGS. 4A to 4E are plan views for explaining the method of manufacturing the circuit board.

With reference to the drawings, the method of manufacturing the circuit board of the present invention will be described.

First, a silicon wafer is used as a substrate 11, and a silicon oxide layer 12 having a thickness of approximately several micrometers is formed on the silicon wafer by thermal oxidation. Then, a conductive layer 13 having a thickness of approximately 200 nm for forming an electrode wiring is formed on the silicon oxide layer 12 (see FIGS. 3A and 4A). Here, Al—Cu is used for the conductive layer 13, but Al, Al—Si, Al—Si—Cu, or the like may also be used for the conductive layer 13.

Figure 3A:
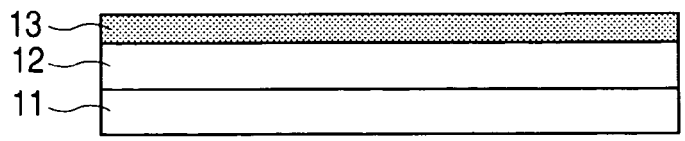
FIGS. 3A, 3B, 3C, 3D and 3E are sectional views taken along a line 3-3 of FIG. 2.
Figure 3B:
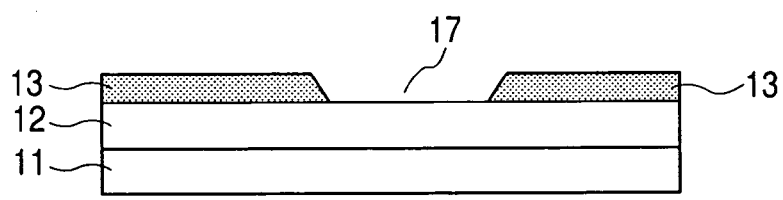
Figure 4A:
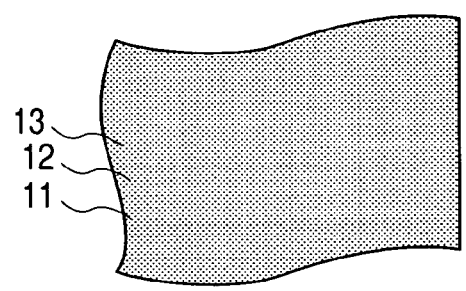
FIGS. 4A, 4B, 4C, 4D and 4E are plan views for explaining the method of manufacturing the circuit board used for the liquid discharge head according to the present invention.
Figure 4B:
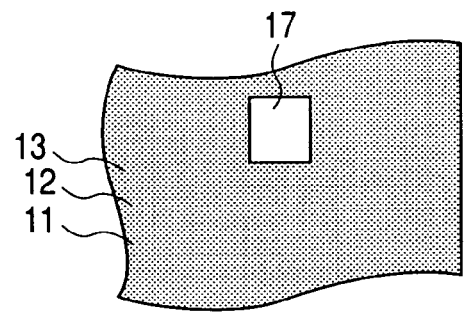

A mask is used to pattern the conductive layer 13 corresponding to a part which composes a heating portion 17 by dry etching or wet etching (see FIGS. 3B and 4B).

The use of dry etching for forming the part which composes the heating portion 17 allows an increase in dimensional accuracy of the electrothermal converting element. The use of wet etching for forming the part which composes the heating portion 17 can lower manufacturing costs.

Figure 3C:
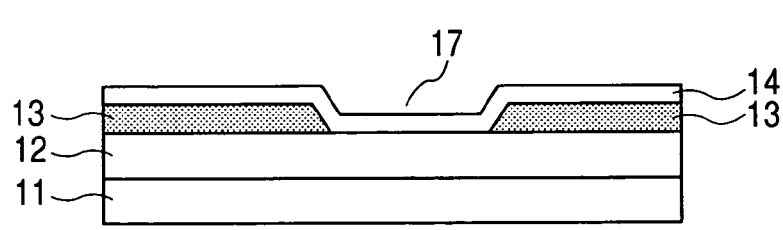
Figure 4C:
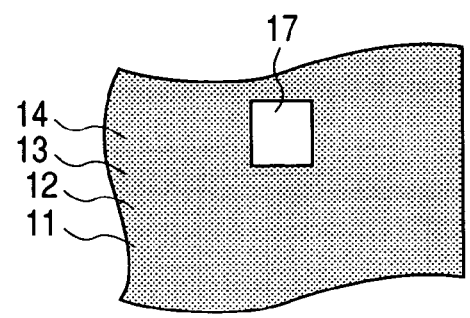

Next, a heating resistor film 14 having a thickness of approximately 50 nm is formed by a sputtering method (see FIGS. 3C and 4C).

TaSiN is used here for the heating resistor film 14; however, TaN, $HfB_2$, or the like may be used as well.

Figure 3D:
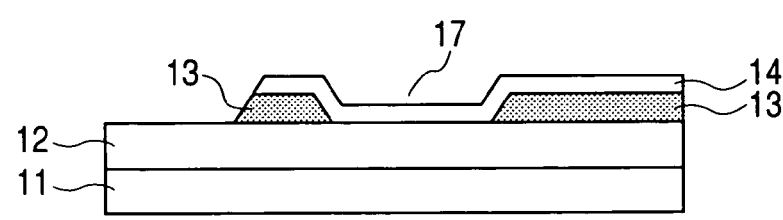
Figure 3E:
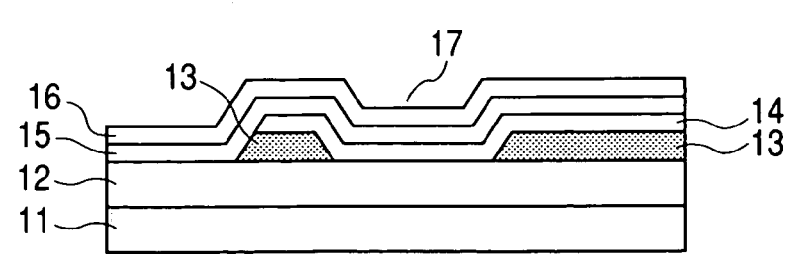
Figure 4D:
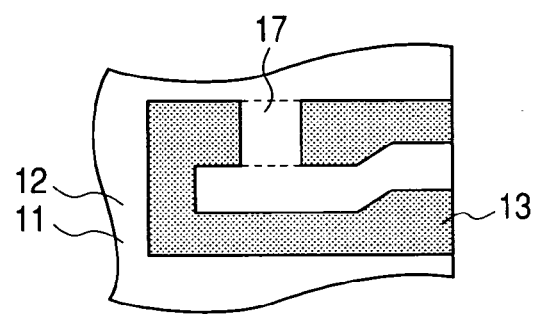
Figure 4E:
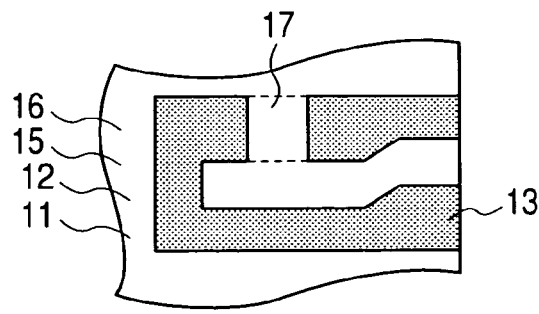
Figure 5:
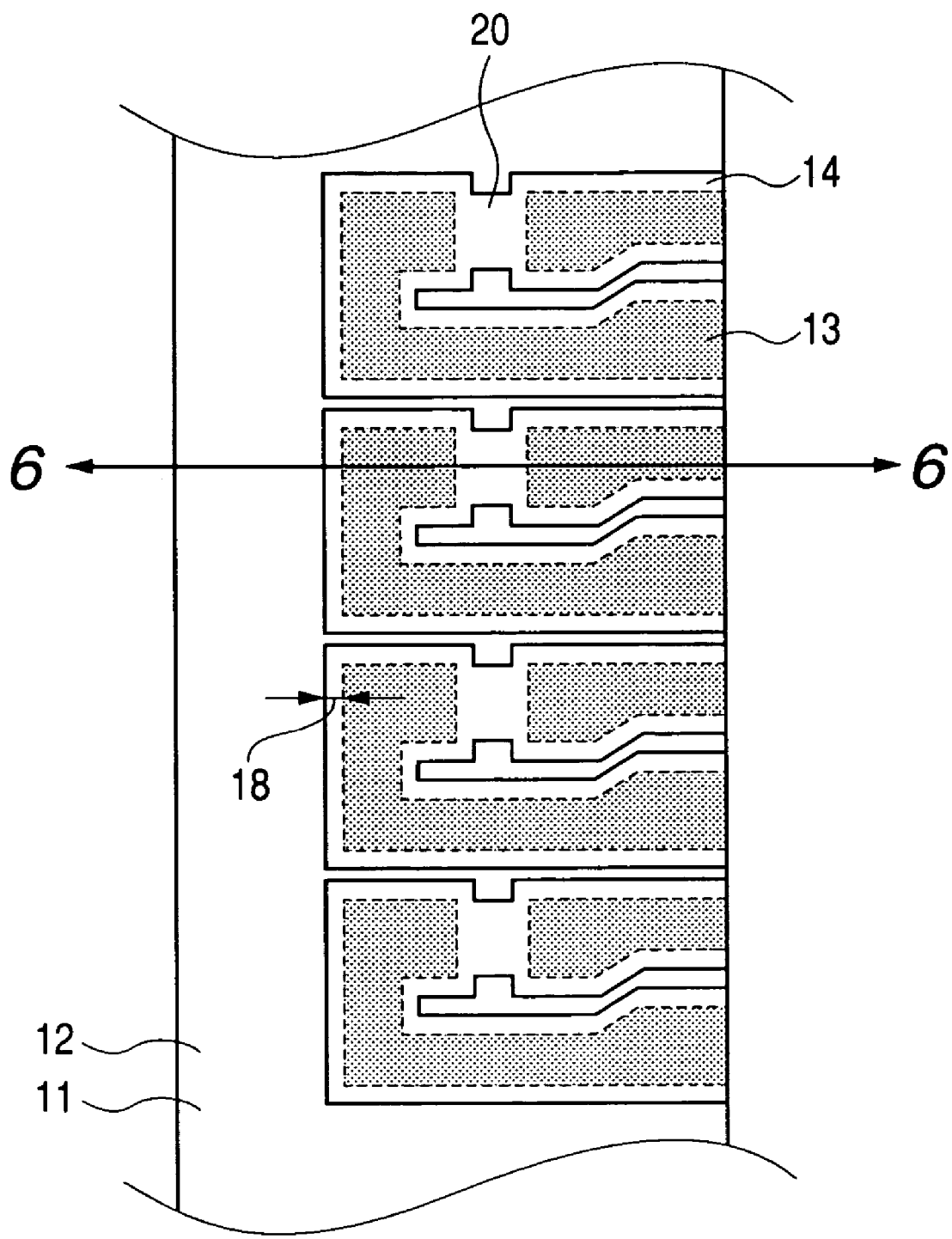
FIG. 5 is a plan view showing electrothermal converting elements on a conventional circuit board used for a liquid discharge head.
Figure 6A:
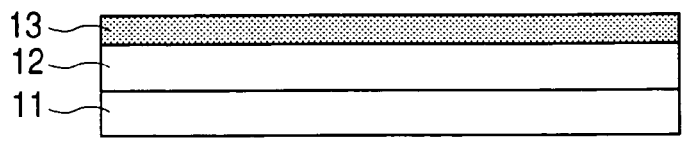
FIGS. 6A, 6B, 6C, 6D and 6E are sectional views taken along a line 6-6 of FIG. 5.
Figure 6B:
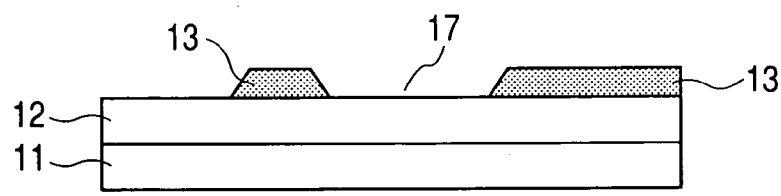
Figure 6C:
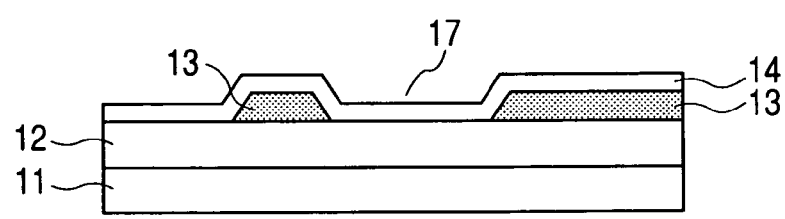
Figure 6D:
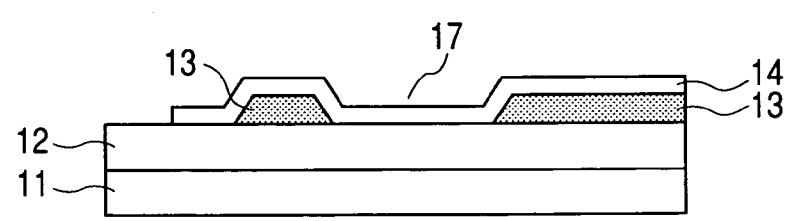
Figure 6E:
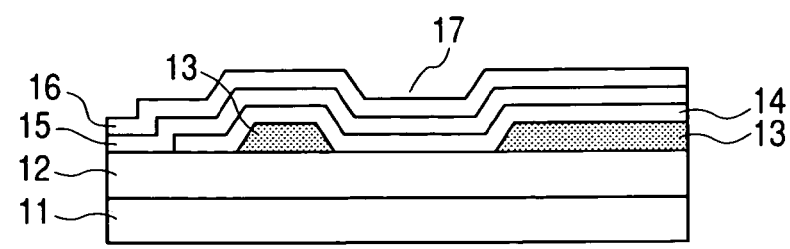
Figure 7A:
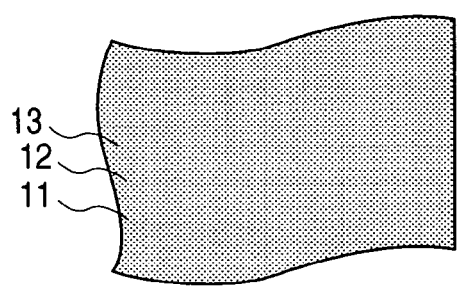
FIGS. 7A, 7B, 7C, 7D and 7E are plan views for explaining a method of manufacturing the conventional circuit board used for the liquid discharge head.
Figure 7B:
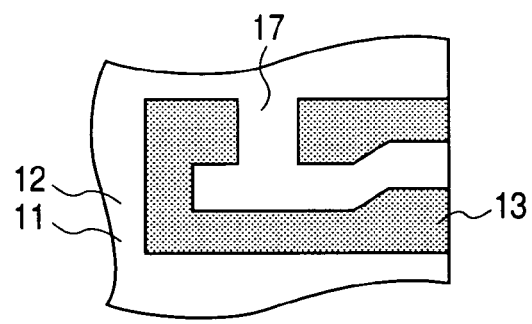
Figure 7C:
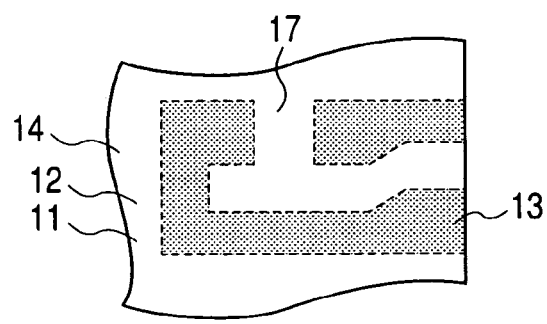
Figure 7D:
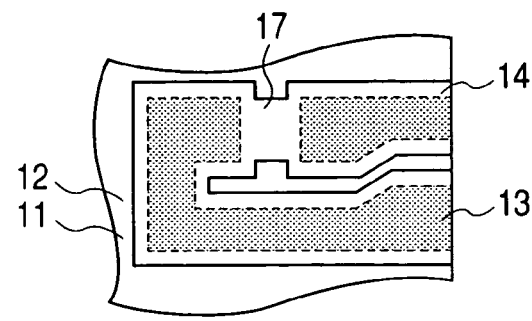
Figure 7E:
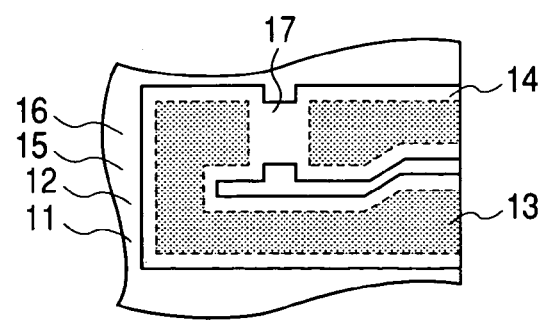

Next, using a mask, the heating resistor film 14 and the conductive layer 13 are collectively etched for isolation, to thus form the electrode wiring (see FIGS. 3D and 4D). This collective etching is carried out by dry etching.

Then, a protective film 15 made of P—SiN is formed by a CVD method. The protective film 15 has a thickness of approximately 300 nm. After that, a cavitation resistance film 16 made of Ta is formed on the protective film 15 by a sputtering method. The thickness of the cavitation resistance film 16 is 230 nm. (see FIGS. 3E and 4E).

A discharge port is formed on the circuit board thus obtained, whereby the liquid discharge head can be manufactured. Specifically, a nozzle wall, a top plate, and the like are provided on the circuit board to form a discharge portion including the discharge port and an ink flow path.

Figure 1A:
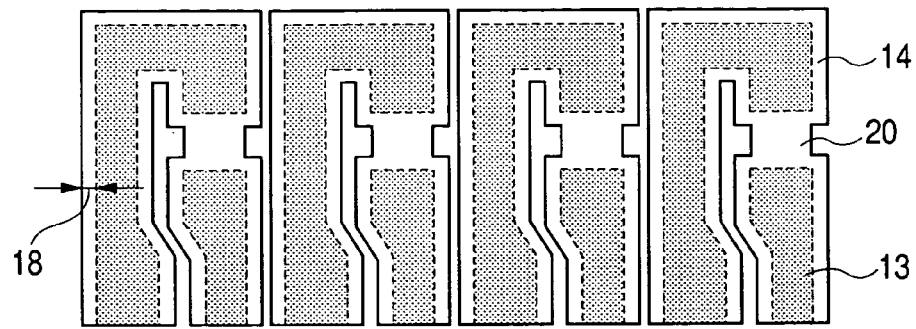
FIGS. 1A, 1B and 1C are plan views for explaining a method of manufacturing a circuit board used for a liquid discharge head according to the present invention.
Figure 1B:
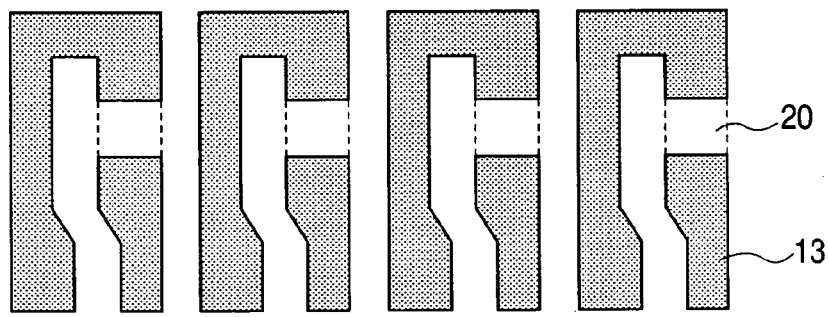
Figure 1C:
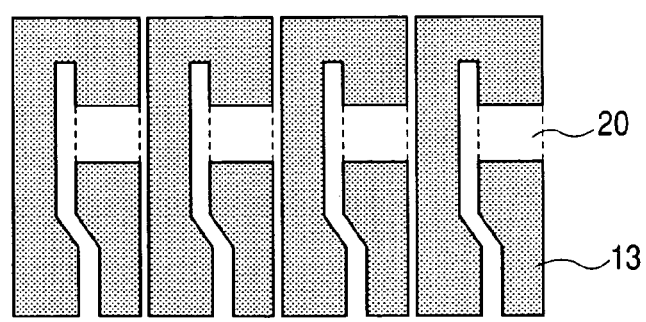

The circuit board on which the electrothermal converting elements are formed as described above was conventionally designed as shown in FIG. 1A, but can be implemented to an embodiment of the present invention as shown in FIG. 1B which does not require the heating resistor film space 18. Further, as shown in FIG. 1C, a higher density recording head which provides high resolution images can be realized without changing a design rule of the electrode wiring.

Figure 8A:
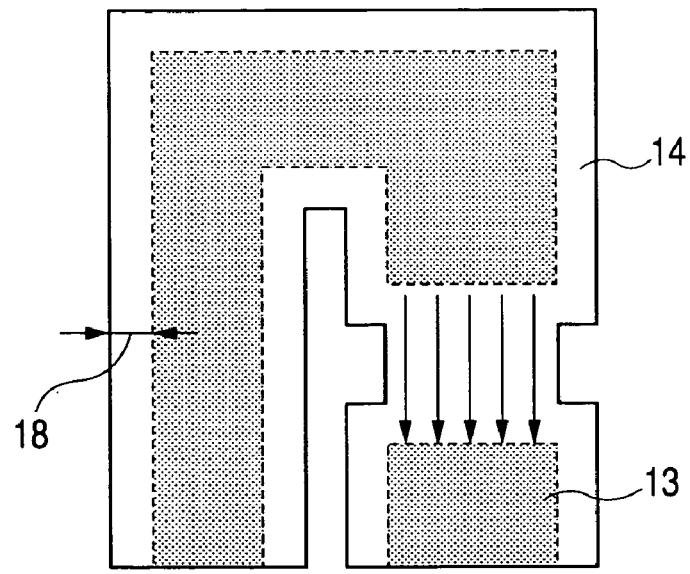
FIGS. 8A and 8B are plan views showing the electrothermal converting element in a case where a misalignment occurs on the conventional circuit board used for the liquid discharge head.
Figure 8B:
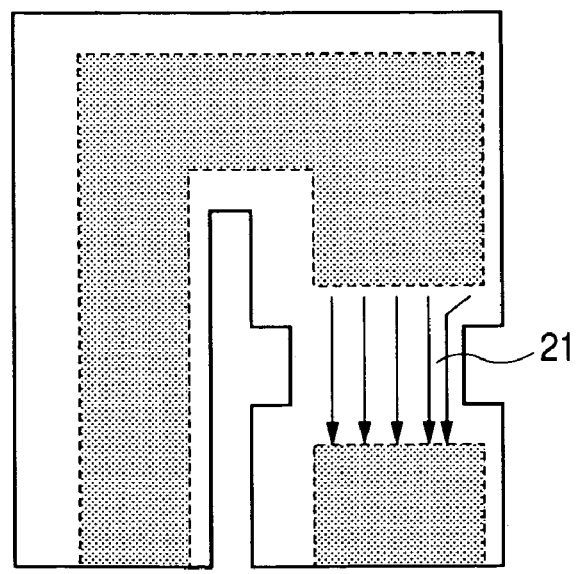

In addition, with the structure of the electrothermal converting element of the present invention, a predetermined area for a heating resistor can be obtained irrespectively of a misalignment, so that a current concentration portion 21 as shown in FIG. 8B is not formed. Therefore, it is possible to improve the endurance of the electrothermal converting element.

Figure 9:
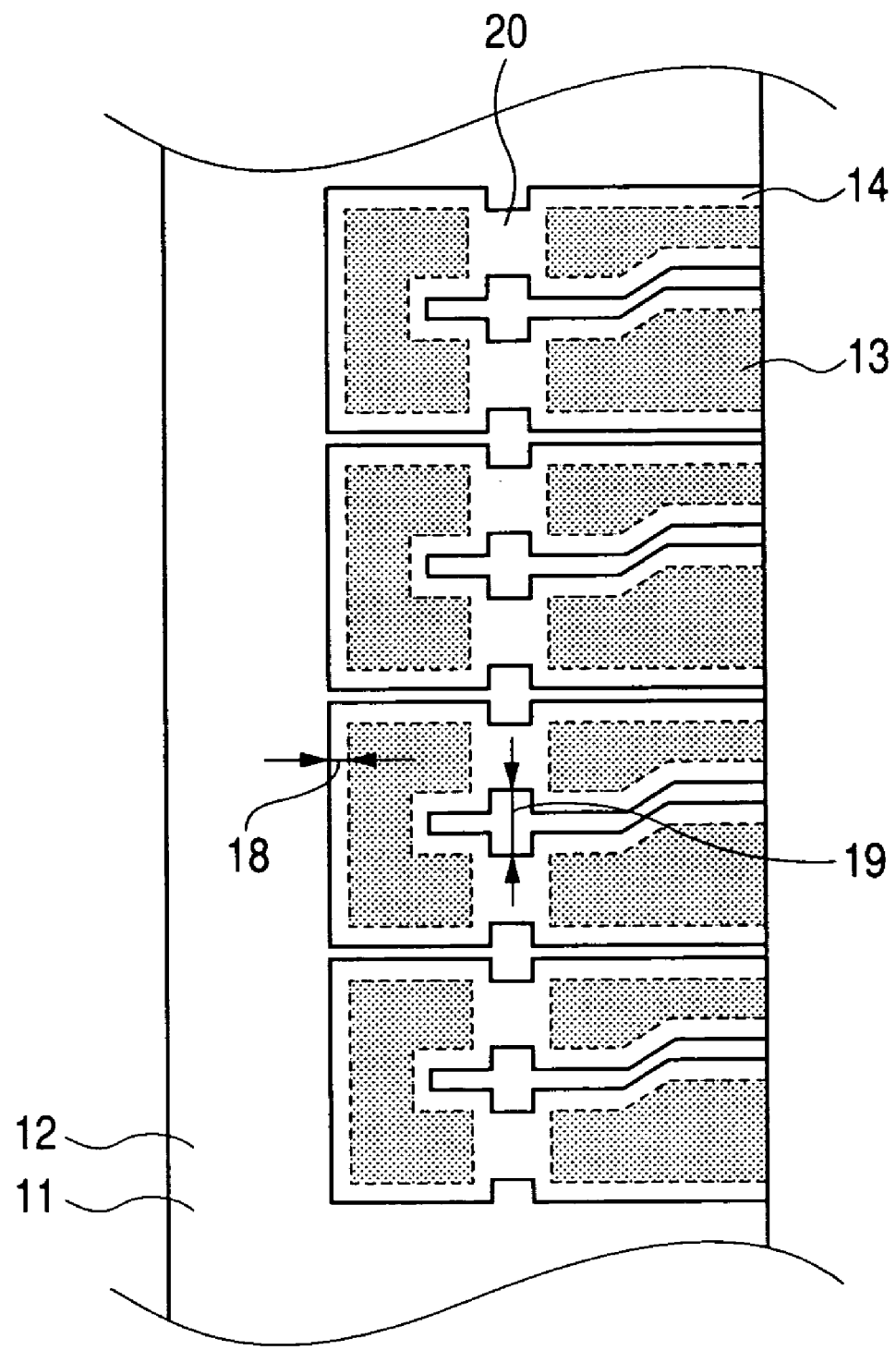
FIG. 9 is a plan view showing the electrothermal converting elements on the conventional circuit board used for the liquid discharge head according to another form.

Further, when the manufacturing method of the present invention is employed to manufacture the electrothermal converting element according to another embodiment as shown in FIG. 9, since there is no heating resistor film space 18, a heating space 19 can be narrowed. Thus, a recording head in which its bubbling efficiency is increased and applied energy is reduced can be realized.

(Liquid discharge apparatus)

A liquid discharge head according to an embodiment of the present invention can be manufactured by: forming a heating resistor which has a heating resistor layer formed on an insulating layer of a semiconductor device according to the embodiments described above; assembling a discharge-port-forming member such as a top plate which is made from a molded resin, a film, or the like in order to form a discharge port and a liquid flow path. The liquid discharge head is connected to a container and mounted to an ink jet printer main body, a power supply voltage is supplied to the liquid discharge head from a power supply circuit of the ink jet printer main body, and image data is sent to the liquid discharge head from an image processing circuit. The ink jet printer can thus operate as such.

Figure 10:
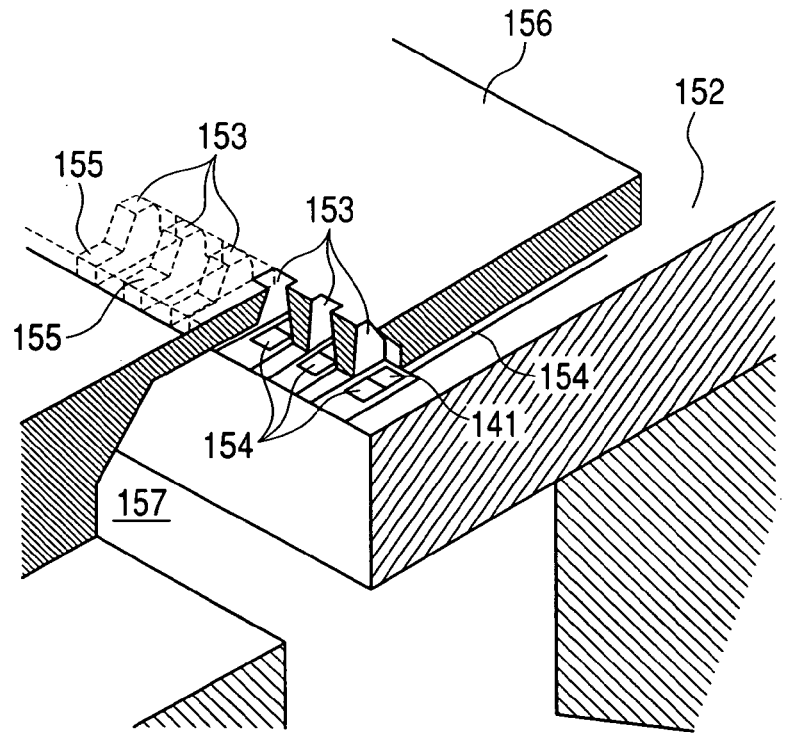
FIG. 10 is a schematic diagram for explaining a liquid discharge head according to an embodiment of the present invention.

FIG. 10 is a schematic diagram for explaining a liquid discharge head according to an embodiment of the present invention, showing a part of the liquid discharge head.

On an element base member 152 on which the circuit board of the present invention is manufactured, plural electrothermal converting elements 141 are arranged in a plurality of rows, which generate heat by receiving an electrical signal causing a current to flow, and discharge ink from discharge ports 153 by air bubbles generated by the heat. The wiring electrode 154 is provided for each of the electrothermal converting elements 141 to supply an electrical signal for driving each electrothermal converting element 141. One end of the wiring electrode 154 is electrically connected to a switch element 41.

Flow paths 155 for supplying the ink to the discharge ports 153 which are provided at positions opposed to the electrothermal converting elements 141 are provided correspondingly associated with the discharge ports 153. Walls defining each of the discharge ports 153 and the flow paths 155 are provided in a grooved member 156. The grooved member 156 is connected to the above-mentioned element base member 152, thereby providing a common liquid chamber 157 for supplying the ink to the plural flow paths 155.

Figure 11:
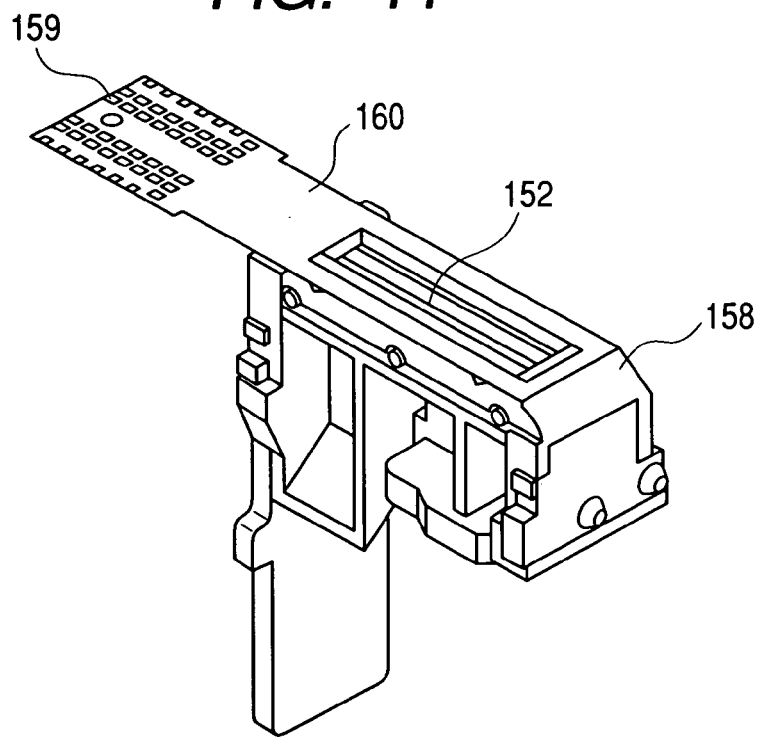
FIG. 11 is a schematic diagram showing a structure of the liquid discharge head in which the circuit boards of the present invention are included.

FIG. 11 shows the structure of the liquid discharge head of the present invention, in which the element base member 152 is included. The element base member 152 is included in a frame body 158. The element base member 152 has the grooved member 156 attached thereon which constitutes the discharge port 153 and the flow path 155. A contact pad 159 is provided to receive an electrical signal from the liquid discharge apparatus side. Thus, electrical signals serving as various drive signals are supplied to the element base member 152 from a controller of the liquid discharge apparatus main body through a flexible printed wiring board 160.

Figure 12:
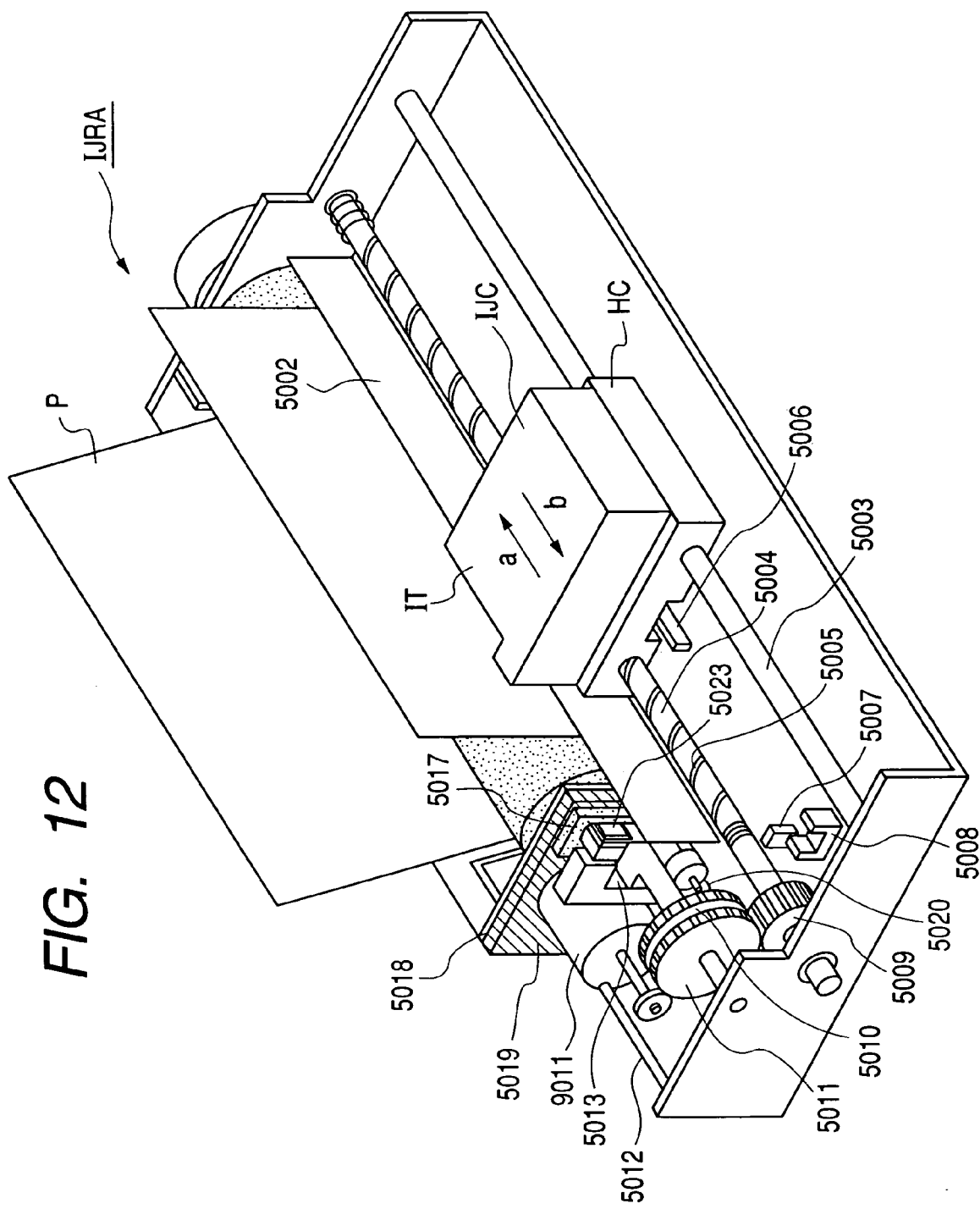
FIG. 12 is a schematic diagram showing an embodiment of a liquid discharge apparatus to which the liquid discharge head according to the present invention is applied.

FIG. 12 is a schematic view for explaining the liquid discharge apparatus of an embodiment to which the liquid discharge head of the present invention is applied, which shows an ink jet recording apparatus IJRA.

A carriage HC engages with a spiral groove 5004 of a lead screw 5005 which rotates through driving force transmission gears 5011 and 5009 in conjunction with a normal/reverse rotation of a drive motor 5013. The carriage HC has a pin (not shown) and moves back and forth in the directions of arrows a and b.

Reference numeral 5002 indicates a paper holding plate which presses a paper P against a platen 5000 serving as recording-medium conveying means along the direction in which the carriage HC is moved. Photocouplers 5007 and 5008 serve as home position detection means that confirms the presence in this region of a lever 5006 of the carriage HC and performs a switching operation of the rotating direction of the drive motor 5013. A support member 5016 supports a cap member 5022 that caps a front side of the recording head. Suction means 5015 absorbs ink within the cap member 5022 and performs a suction recovery operation for the recording head through an opening 5023 in the cap member 5022. Reference numeral 5017 indicates a cleaning blade, and a moving member 5019 enables the cleaning blade 5017 to move in the backward and forward directions (the directions perpendicular to the direction the carriage HC is moved). The cleaning blade 5017 and the moving member 5019 are supported by a main body support plate 5018. The cleaning blade 5017 is not limited to this form, and any known type cleaning blade may be applied to this embodiment. Reference numeral 5012 indicates a lever which is used to start the suction for the suction recovery operation, and is moved in association with the movement of a cam 5020 that engages with the carriage HC, and the driving force from the drive motor 5013 is controlled by well-known transmission means such as clutch switching means.

With the above-described structures for capping, cleaning, and suction recovery, desired processes can be performed at corresponding positions by the operation of the lead screw 5005 when the carriage HC is moved to the home position region. As long as the desired processes are performed at known timing, any structure can be applied to this embodiment. The above-described structures are excellent inventions whether they are applied singly or in combination. The structures are preferable for the present invention.

Note that the liquid discharge apparatus has a controller-drive-signal supplying means (not shown) composed of electric circuits for supplying a power supply voltage, an image signal, a drive control signal, and the like to the element base member 152.

The present invention is not limited to the embodiments described above, and it is apparent that each component of the present invention may be replaced with any substitute or equivalent that can solve the above-mentioned problem.

This application claims priority from Japanese Patent Application No. 2003-312634 filed Sep. 4, 2003, which is hereby incorporated by reference herein.

What is claimed is:

1. A method of manufacturing a circuit board including an electrode wiring formed above a surface portion of a substrate; and a plurality of electrothermal converting elements which have a heating resistor film for generating thermal energy formed above the electrode wiring, the method comprising the steps of:

forming a conductive layer for forming the electrode wiring on an oxide layer on the substrate;

partially etching the conductive layer to remove the conductive layer from an area on the oxide layer;

forming the heating resistor film covering the area on the oxide layer, after the step of partially etching; and collectively etching for patterning the conductive layer and the heating resistor film, respectively, into the electrode wiring and the electrothermal converting element.

2. The method of manufacturing the circuit board according to claim 1, further comprising the step of removing a part of the conductive layer corresponding to a heating portion, wherein the removing is carried out by one of dry etching and wet etching.

3. The method of manufacturing the circuit board according to claim 1, wherein the collectively etching step is carried out by dry etching.

4. The method of manufacturing the circuit board according to claim 1, further comprising the steps of:
   forming the conductive layer by tapering; and
   forming a protective layer directly on a tapered part of the electrode wiring.

5. The method according to claim 1, wherein, in the step of collectively etching, a single mask is used for patterning the conductive layer and the heating resistor film.

* * * * *